United States Patent
Ishikura et al.

(10) Patent No.: US 7,542,368 B2
(45) Date of Patent: Jun. 2, 2009

(54) SEMICONDUCTOR MEMORY DEVICE

(75) Inventors: Satoshi Ishikura, Osaka (JP); Hironori Akamatsu, Osaka (JP); Kazuo Itoh, Osaka (JP); Yoshinobu Yamagami, Kyoto (JP)

(73) Assignee: Panasonic Corporation, Osaka (JP)

( * ) Notice: Subject to any disclaimer, the term of this patent is extended or adjusted under 35 U.S.C. 154(b) by 109 days.

(21) Appl. No.: 11/634,110

(22) Filed: Dec. 6, 2006

(65) Prior Publication Data

US 2007/0133326 A1 Jun. 14, 2007

(30) Foreign Application Priority Data

Dec. 7, 2005 (JP) ............... 2005-353947

(51) Int. Cl.
*G11C 5/14* (2006.01)
*G11C 7/00* (2006.01)
*G11C 7/10* (2006.01)
*G11C 11/00* (2006.01)

(52) U.S. Cl. ............ 365/226; 365/201; 365/189.5; 365/154; 365/156

(58) Field of Classification Search ............ 365/154, 365/156, 226, 189.05, 201
See application file for complete search history.

(56) References Cited

U.S. PATENT DOCUMENTS

| | | | |
|---|---|---|---|
| 5,276,647 A * | 1/1994 | Matsui et al. | 365/201 |
| 5,463,585 A * | 10/1995 | Sanada | 365/201 |
| 6,081,465 A * | 6/2000 | Wang et al. | 365/201 |
| 6,088,820 A | 7/2000 | Jyo et al. | |
| 6,249,468 B1 | 6/2001 | Kan et al. | |
| 7,075,838 B2 * | 7/2006 | Jeung et al. | 365/201 |
| 7,099,182 B2 * | 8/2006 | Ohtake et al. | 365/154 |
| 7,333,357 B2 * | 2/2008 | Houston | 365/154 |
| 7,349,271 B2 * | 3/2008 | Kuang et al. | 365/201 |
| 7,376,001 B2 * | 5/2008 | Joshi et al. | 365/154 |
| 7,382,674 B2 * | 6/2008 | Hirabayashi | 365/226 |
| 2004/0008550 A1 | 1/2004 | Son et al. | |

OTHER PUBLICATIONS

Yamaoka, et al., "Low-Power Embedded SRAM Modules with Expanded Margins for Writing," 2005 IEEE International Solid-State Circuits Conference, Feb. 9, 2005, Session 26/Static Memory/26.4, IEEE.

* cited by examiner

*Primary Examiner*—Trong Phan
(74) *Attorney, Agent, or Firm*—McDermott Will & Emery LLP

(57) ABSTRACT

A semiconductor memory device includes a memory cell having a circuit configuration in which a potential supplied to sources of load transistors 108 and 111 included in a latch section is different from at least one of a potential supplied to a word line 105 and a potential supplied to bit lines 106 and 107; a latch potential control circuit 101 for switching a normal operation mode and a test mode to each other in accordance with a signal applied to a test mode setting pin 102; and a read/write control circuit 103 for controlling the potential supplied to the sources of the load transistors 108 and 111 to be lower than at least one of the potential supplied to the word line 105 and the potential supplied to the bit lines 106 and 107, during an arbitrary period of at least a read operation in the test mode.

11 Claims, 14 Drawing Sheets

F I G. 2 0   PRIOR ART
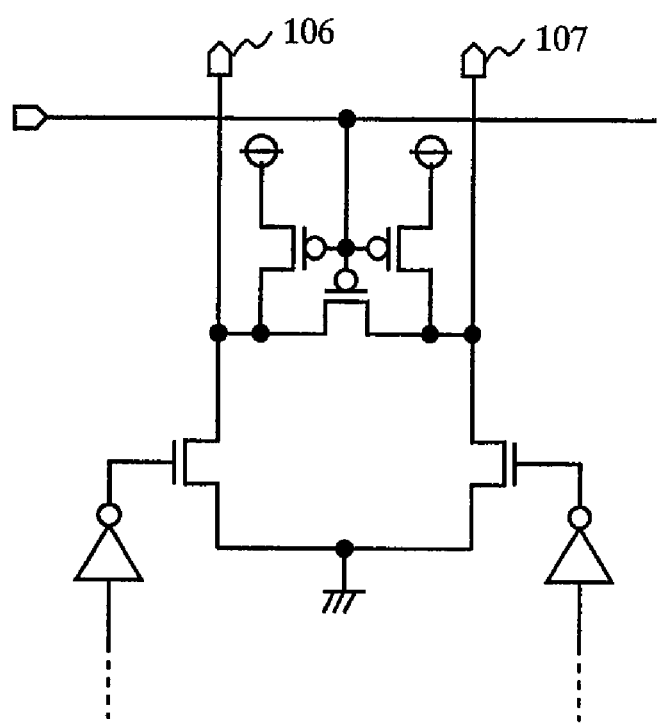

SEMICONDUCTOR MEMORY DEVICE

BACKGROUND OF THE INVENTION

1. Field of the Invention

The present invention relates to a technology for an SRAM circuit as a semiconductor memory device, and more particularly to a technology for screening bits which are defective in cell characteristics including static noise margin, write level or the like, which is caused by over-time deterioration or operation noise of a logic circuit located in the vicinity of the SRAM.

2. Description of the Background Art

In recent precision semiconductor devices, increase in random variance in transistor (hereinafter, referred to as "Tr") characteristics caused by size reduction, and variance in SRAM characteristics caused by the random variance in Tr characteristics, are serious problems. In semiconductor devices of the conventional generation, it was sufficient to obtain a certain degree of beta ratio, which is the ratio of the driving capability of a drive Tr with respect to the driving capability of an access Tr. The cell size was substantially determined in consideration of only the processing conditions during the production. Therefore, the influence of the random variance was trivial enough to be buried in the discussion on the inter-lot variance (hereinafter, referred to the "global variance").

However, in semiconductor devices of the 65 nm rule or newer process generations, the ratio of random variance in each chip with respect to global variance has been rapidly increasing due to the size reduction. Therefore, with the conventional structure, it is very difficult to produce devices having good cell characteristics in the Mbit order. In order to solve this, techniques are being studied by which, for example, good cell characteristics are obtained by making the gate length, gate width or other elements of the device size larger than the processing limit, or requirements for the SRAM cell characteristics are alleviated by dynamically controlling the power supply potential from the peripheral circuits to the memory cells. See, for example, "ISSCC2005 Low-Power Embedded SRAM Modules with Expanded Margins for Writing", Hitach, Renesas.

Despite such efforts, it is becoming more difficult to obtain good products than in the past process generations. Cell characteristic margins are being reduced with certainty. Important SRAM characteristics include static noise margin (hereinafter, referred to as "SNM") which indicates the cell stability during the read operation, write level indicating the ease of writing, cell current during the read operation, and standby current. With reference to FIG. 18, a mechanism by which an insufficient SNM leads to malfunction will be described.

It is assumed now that bit lines 1001 and 1002 are precharged to a High potential, an intermediate node 1003 is at a Low potential, an intermediate node 1004 is at a High potential, and the lines 1001 and 1002 and the nodes 1003 and 1004 are all stable. A read operation is performed from this state. When the potential of a word line 1000 becomes High, an access Tr 1005 is place into an ON state. Since the access Tr 1005 and a drive Tr 1012 in an ON state each other, the potential of the intermediate node 1003 becomes slightly higher than the Low potential. If the potential of the intermediate node 1003 exceeds the logic threshold of an inverter 1007, the inverter 1007 performs inversion. As a result, the intermediate node 1004 is driven from a High potential to a Low potential. This causes malfunction. The logic threshold of the inverter 1007 becomes high when a load Tr 1009 has a high capability and a drive Tr 1010 has a low capability. Namely, when the load Tr 1009 has a lower Vt potential, there is a larger margin for the rise of the potential of the intermediate node 1003. The SNM is deteriorated when the access Tr 1005 is at a Low Vt potential, the drive Tr 1012 is at a High Vt potential, the load Tr 1009 is at a High Vt potential, and the drive Tr 1010 is at a Low Vt potential. The problem of variance also occurs regarding other characteristics including write level and cell current.

Under the circumstances, the present inventors found the practical causes of the above problems.

First, the cell characteristics are deteriorated over-time at a high possibility. This was not conspicuous in the devices in the conventional process generations because there was a large margin for the cell characteristics. However, this is conspicuous today because the margin for good cell characteristics is very small, or slightly defective bits are handled by the redundancy rescue technology and shipped as satisfactory products. In addition, SNM is sensitive against the power supply noise or the like as is clear from the name. Therefore, some memories operate normally when independently inspected, but become defective due to the noise supplied to the power supply system as a result of the operation of a great number of logics in the vicinity thereof.

Specific examples of the over-time deterioration include NBTI (Negative Bias Temperature Instability) deterioration of Pch Tr. This is a phenomenon of device deterioration that when the state where a Pch Tr is in an ON state, i.e., the state where the gate is at a low potential, is continued, the Vt potential of the Pch Tr is shifted to a higher potential. Examples of the over-time deterioration of Nch Tr include hot carrier deterioration discussed regarding the 5V- and 3V-system generations.

In the low-voltage precision process, the power supply itself is lower and the NBTI deterioration of Pch Tr occurs by merely placing the Pch Tr into a standby state with the power supply being ON. By contrast, the hot carrier deterioration of Nch Tr occurs only during a transition operation in which the LSI is operated and the gate is in an intermediate potential state. For this and other reasons, the hot carrier deterioration of Nch Tr is not considered as a serious problem.

Due to the difference in the over-time deterioration mode between Pch Tr and Nch Tr or the like, it may occur that the Vt potential of the Nch Tr is kept almost the same and the Vt potential of only the Pch Tr is raised from the initial state. In the state where there is almost no margin between the operation limit and the global variance assumed from the point of device production, when the Pch load Tr is deteriorated over-time and the Vt potential thereof is raised, an SRAM which had a good SNM at the pre-shipment test exhibits SNM deterioration due to the reduction in the logic threshold of the inverter with which the SRAM is to be incorporated.

The NBTI deterioration influences the write level corresponding to the write margin in addition to the SNM corresponding to the read margin. It is true that as the Vt potential of the Pch Tr is raised, the write is made easier. However, the stress by the NBTI deterioration varies in accordance with the potential state. Therefore, among complementary inverter latches, the NBTI deterioration may occur only in the Pch which is in an ON state for an extended period of time. As a result, whereas the Vt potential of one load Tr 1009 is not shifted, the Vt potential of the other load Vt 1011 may raised over-time due to NBTI deterioration. When the potential of the bit line 1002 is lowered to perform a write operation, the potential of the intermediate node 1004 becomes Low since the load Tr 1009 and an access Tr 1006 in an ON state each other. The inverter 1008 receives this potential. When the Vt potential of the load Tr 1011 is high, the logic threshold of the inverter 1008 is low, and the write level may be deteriorated so that the write operation cannot be performed unless the potential of the intermediate node 1004 is further lowered. In the above, the deterioration on the Pch Tr side is described, but the deterioration on the Nch Tr side may possibly become conspicuous in the future. The over-time deterioration in the cell characteristics is not limited to the situations described above.

Defects may occur due to an operational environment in addition to the over-time deterioration. For example, even when no problem is found by an independent SRAM macro test or evaluation using a tester, defects may occur by the highly active operation performed by the logic section located in the vicinity of the SRAM on the LSI or by the low strength of the board on which the SRAM is mounted. The present inventors concluded that it is necessary to obtain an appropriate cell characteristic margin against the cell characteristic deterioration caused over-time or by an operational environment.

SUMMARY OF THE INVENTION

Therefore, an object of the present invention is to provide a semiconductor memory device capable of obtaining appropriate cell characteristic margins and thus avoiding the reduction in the yield even when the cell characteristics are deteriorated over-time or by a change in the operational environment.

The present invention is directed to a semiconductor memory device for storing information on a memory cell using a potential change in a word line and a bit line. In order to attain the object mentioned above, the semiconductor memory device according to the present invention comprises a memory cell, a first control circuit and a second control circuit.

The memory cell has a circuit configuration in which a potential supplied to a source of a load Tr included in a latch section is different from at least one of a potential supplied to the word line and a potential supplied to the bit line. The control circuit switches a normal operation mode and a test mode to each other in accordance with a signal applied to a test mode setting pin. During an arbitrary period of at least a read operation (or a write operation) in the test mode, the second control circuit controls the potential supplied to the source of the load Tr to be lower (or higher) than at least one of the potential supplied to the word line and the potential supplied to the bit line, or controls the load Tr to be in a non-driven state by cutting off the supply of the potential to the source of the load Tr by a switching device.

The memory cell may have a circuit configuration in which a potential supplied to the word line is different from at least one of a potential supplied to a source of a load Tr included in a latch section and a potential supplied to the bit line. In this case, during an arbitrary period of at least a read operation (or a write operation) in the test mode, the second control circuit controls the potential supplied to the word line in a ON state, corresponding to at least one of the potential supplied to the source of the load Tr and the potential supplied to the bit line, to be higher (or lower) than a potential in the normal operation mode.

The memory cell may have a configuration in which a potential supplied to the bit line is different from at least one of a potential supplied to a source of a load Tr included in a latch section and a potential supplied to the word line. In this case, during an arbitrary period of at least a read operation (or a write operation) in the test mode, the second control circuit controls the potential supplied to a bit line which is kept at a higher potential during a write operation, among the bit lines corresponding to at least one of the potential supplied to the source of the load Tr and the potential supplied to the word line, to be higher (lower) than a potential in the normal operation mode.

In the case where the memory cell has a latch section including a Pch Tr and an Nch Tr, during an arbitrary period of at least a read operation (or a write operation) in the test mode, the second control circuit may control a substrate potential of the Pch Tr to be higher (or lower) than a potential in the normal operation mode and apply a back bias (or a forward bias) to the Pch Tr, or control a substrate potential of the Nch Tr to be higher (or lower) than a potential in the normal operation mode and apply a forward bias (or a back bias) to the Nch Tr.

Preferably, also during an arbitrary period of a write operation in the normal operation mode, the second control circuit controls the potential supplied to the source of the load Tr to be lower than at least one of the potential supplied to the word line and the potential supplied to the bit line, or controls the load Tr to be in the non-driven state by cutting off the supply of the potential to the source of the load Tr by the switching device. The second control circuit preferably controls the potential in the test mode only on a column or a row on which a memory cell is present which is a target of the read operation.

The second control circuit may control a potential supplied to a bit line, among bit lines, which is operated at a lower potential during a write operation to the memory cell to be higher than a potential in the normal operation mode, in the test mode. The semiconductor memory device may further comprise a BIST circuit for providing a test signal to the test mode setting pin and performing an inspection including a stress test.

The present invention is also directed to a method for inspecting a semiconductor memory device for storing information on a memory cell using a potential change in a word line and a bit line. In order to attain the object mentioned above, according to the method according to the present invention, after a write operation, a potential of the entirety of a macro power supply or a power supply section including at least a memory cell is temporarily lowered from a normal potential to a predetermined lower potential; the potential of the power supply is returned back to the normal potential, and then a read operation is performed; and a pass/fail determination is performed by the read operation.

Alternatively, after a write operation is performed at a normal power supply potential, the potential of the entirety of a macro power supply is temporarily lowered from the normal potential to a predetermined lower potential, or the semiconductor memory device is set to a predetermined static noise margin stress mode, and a read operation is performed without a pass/fail determination; the potential of the power supply is returned back to the normal potential, and then the read operation is performed again; and the pass/fail determination is performed by the read operation performed the second time.

In the case of performing the read operation without the pass/fail determination, when the word line is placed into an ON state, it is desirable to activate a plurality of the word lines simultaneously or to keep the bit line precharged.

According to the present invention, the semiconductor device can be set to a test mode which is different from the normal operation mode. The potential of a first power supply in the memory cell latch section is lower than the potential of a second power supply, which is at least one of the word line driver power supply and the bit line precharge circuit power supply. Therefore, the logic threshold of an inverter is lowered by the effect of the first power supply, and the latch node potential at a Low potential is raised by the effect of the second power supply. As a result, data destruction in the read operation is likely to occur. Thus, the SNM deterioration which is likely to occur over-time is tested in a severe condition, and an operation margin of the LSI against the over-time deterioration can be obtained. Regarding the cell current for lowering the potential of the bit line in the read operation, the High potential of the gate of the drive Tr is slightly lowered. The source-drain potential of the access Tr and the drive Tr supplied with a back bias which dominates the cell current is not lowered as long as the potential of the bit line and the potential of the word line which is applied to the gate of the access Tr is kept high. Regarding the write operation, if merely the latch potential is lowered, the operation margin is increased. If the test does not need to be used also as the test for the write margin, the test can be performed while the power supply of the latch section is low even during the write operation. A test in consideration of high temperature can be performed at room temperature or a low temperature. This suppresses an increase in the inspection cost.

According to the present invention, the power supply from the inverter latch section is cut off in the read operation. This lowers the data retaining capability of the memory cell latch section. Therefore, the potential of the word line is made high in the read operation. When the access Tr becomes conductive, erroneous read is likely to occur.

According to the present invention, when the ON resistance of the access Tr is reduced or when the precharge potential of the bit line is raised, erroneous read is likely to occur. Since the magnitude of the cell current is higher than that in the normal operation mode, no loss in the yield occurs for any reason related to the cell current.

According to the present invention, by applying a back bias to the substrate potential of the Pch Tr of the memory cell, a stress test with the SNM being lowered can be performed. Especially, merely the threshold voltage of the Pch Tr is increased and there is no change on the NchTr side. Therefore, the magnitude of the cell current is not changed from that in the normal operation mode and thus an accurate test is made possible. Accordingly, it is only necessary to apply the substrate bias in the read operation. No test pattern needs to be added, which shortens the test time. A stress test with the SNM being lowered can also be performed by applying a forward bias to the substrate potential of the Nch Tr of the memory cell.

According to the present invention, the "write guarantee circuit" used in the normal operation is also usable as the "stress circuit for the read operation" in the test mode. This realizes effective use of Tr, which reduces the area of the memory macro. The power supply potential control is performed for each column and so is faster than in the case where such control is performed on the entirety of the memory cell array. This makes it easy to set the potential at the same level as the potential in the normal operation for the write operation, and at the same level as the potential in the stress mode for the read operation. Therefore, the SNM stress test can be also used as the normal read test. Thus, the test pattern is prevented from being extended, namely, an increase in the test cost is avoided. A write level stress mode can be created in the test mode by (i) increasing the ON resistance of the access Tr to deteriorate the write characteristic, (ii) lowering the High write potential level from the bit line or raising the Low level write potential from the bit line to decrease the write capability, or (iii) applying a forward bias to the substrate potential of the Pch Tr of the memory cell or applying a back bias to the substrate potential of the Nch Tr of the memory cell to increase the data retaining capability of the memory latch.

According to the present invention, the "SNM guarantee circuit" used in the normal operation is also usable as the "write level stress circuit" in the test mode. This realizes effective use of Tr, which reduces the area of the memory macro. The power supply potential control is performed for each column, and so is faster than in the case where such control is performed on the entirety of the memory cell array. This makes it easy to set the potential at the same level as the potential in the normal operation for the write operation, and at the same level as the potential in the stress mode for the read operation. The write level stress test can be also used as the normal write test. Thus, the test pattern is prevented from being extended, namely, an increase in the test cost is avoided.

According to the present invention, by simply lowering the power supply potential, bits having a low latch retaining capability can be screened out even in a structure in which the power supply cannot be divided or the like. In addition, the test mode setting pin can be used to lower the power supply potential in the memory macro. Owing to this, an SNM margin can be obtained by lowering the power supply potential at the power supply to which both the logics and the SRAMs are connected, with no need to lower the power supply of the logic section. Thus, a test can be performed with the power supply voltage of the memory cell being lowered on the individual macro basis. Therefore, the mode change between the stress mode and the normal operation mode is made easy. The test can be performed with no influence on the logic section. This is especially effective for the LSI inspection because a plurality of macros can be inspected simultaneously when a BIST circuit is used.

According to the present invention, an SNM stress can be applied by performing a dummy read operation at a low voltage with no pass/fail determination on the read data. Then, after the potential is returned back to the level used in the normal operation mode, the pass/fail determination is performed. Therefore, an SNM stress test can be performed while the read current is in exactly the same state as that in the normal operation. Loss in the yield is not caused by the cell current shortage due to the read operation at a low voltage. Since a plurality of word lines can be raised simultaneously, the read inspection time with no pass/fail determination is prevented from being extended.

According to the present invention, the test mode signal is controlled by the BIST circuit. It is not necessary to perform the power supply control or the like simultaneously on the SRAM macros in the entire LSI. A group of SRAM macros tested by a BIST circuit can be individually inspected. Therefore, a test can be performed with the power supply voltage of the memory cell being lowered in each group of SRAM macros to be tested by each BIST circuit. This makes it possible to perform the test with no influence on the logic section or the other groups of SRAM macros, and the LSI inspection can be performed effectively. Since the SNM test can be performed by the BIST circuit, the following effects are provided, for example: the designing restrictions on I/O pins in the chip is alleviated; and the LSI test time is shortened by the simultaneous inspection of a plurality of macros.

These and other objects, features, aspects and advantages of the present invention will become more apparent from the following detailed description of the present invention when taken in conjunction with the accompanying drawings.

BRIEF DESCRIPTION OF THE DRAWINGS

FIG. 20 shows a configuration of a conventional write buffer circuit.

DESCRIPTION OF THE PREFERRED EMBODIMENTS

First Embodiment

A semiconductor memory device according to a first embodiment of the present invention will be described with reference to FIG. 1 through FIG. 3, FIG. 13 and FIG. 19. In the first embodiment, a technology for VDDM control will be described, which mainly corresponds to claims 1, 9 and 16. In this embodiment, for example, in order to prevent over-time deterioration caused by static noise margin (SNM) described above, a test mode setting pin 102 is provided so that a test mode which is different from a normal operation mode can be set. The power supply potential is controlled to reduce the SNM, and thus a state which has an SNM value equivalent to, or lower than, the SNM value after the over-time deterioration is created for inspection.

Figure 1:
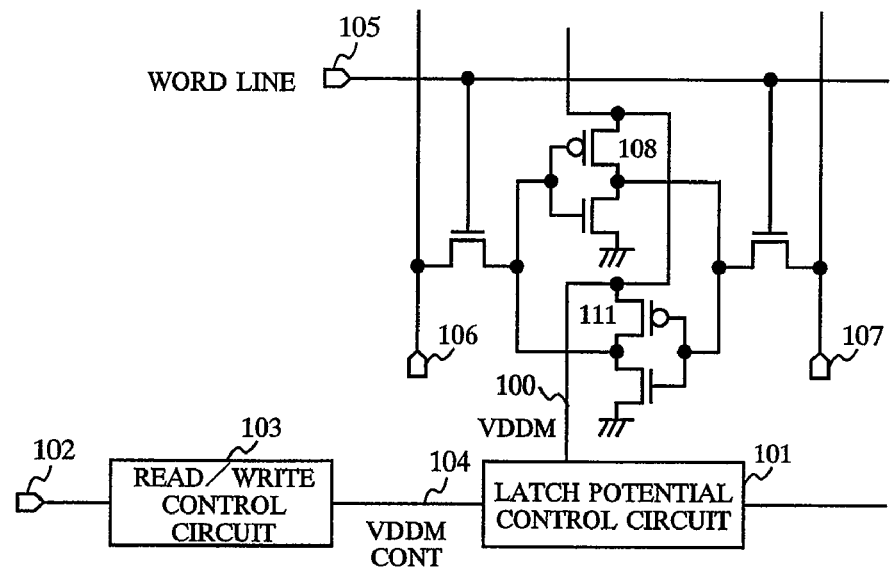
FIG. 1 shows a main circuit configuration of a semiconductor memory device according to a first embodiment of the present invention.
Figure 2:
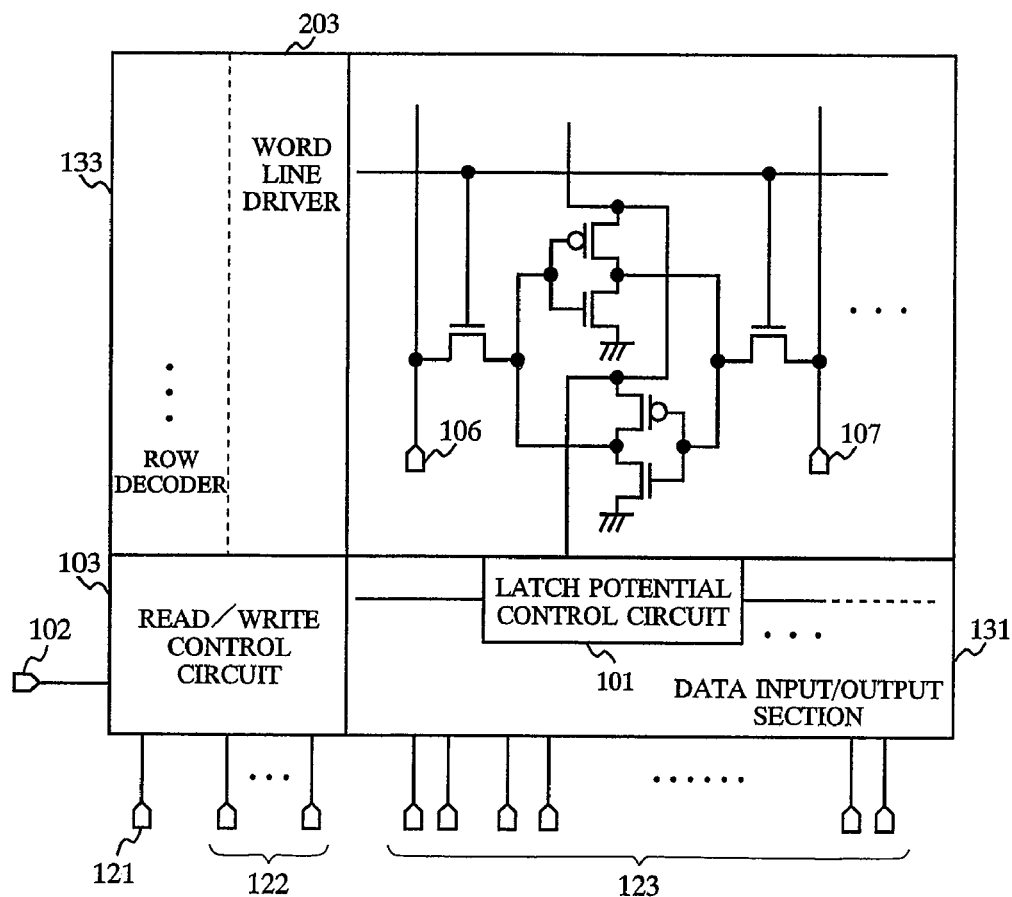
FIG. 2 shows a layout image of a memory macro of the semiconductor memory device according to the first embodiment.

First, a technology for controlling the inverter latch power supply corresponding to claim 1 will be described. FIG. 1 shows a main circuit configuration of a semiconductor memory device according to the first embodiment of the present invention. FIG. 2 shows a layout image of the semiconductor memory device according to the first embodiment in a memory macro (SRAM). In FIG. 2, a reference character 121 is a clock signal line, a reference character 122 is a read/write control signal line, a reference character 123 is a data input/output signal line, a reference character 131 is a "DATA INPUT/OUTPUT SECTION," and a reference character 133 is a "ROW DECODER."

Figure 13:
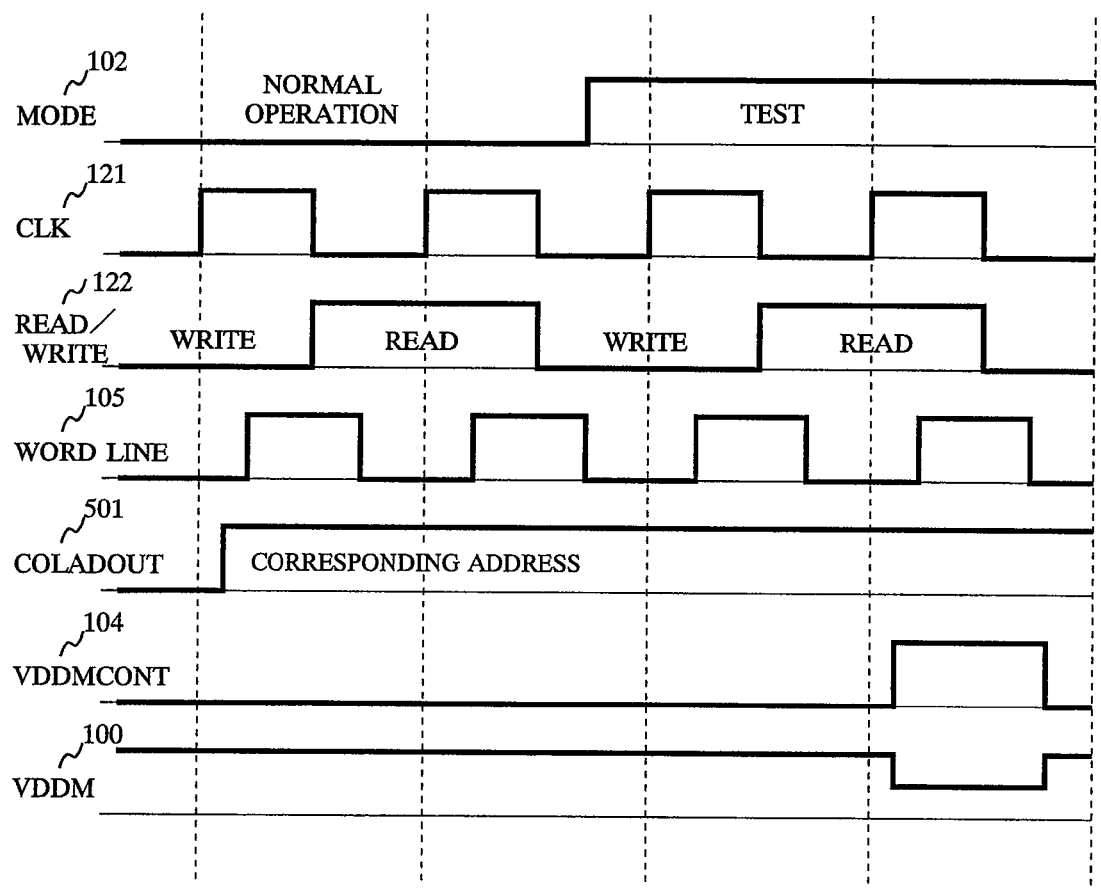
FIG. 13 is an operation timing diagram of the semiconductor memory device according to the first embodiment.

In the semiconductor memory device according to the first embodiment, the test mode setting pin 102 is used for selecting a normal mode for performing a normal read/write operation or an SNM stress test mode for putting the SNM value to a value equivalent to or lower than the value after over-time deterioration. Sources of Pch Tr 108 and Pch Tr 111 in a latch section are connected to a node VDDM 100 which is separated from the power supply, so that the potential of the sources are controllable by a latch potential control circuit 101. As shown in a timing diagram in FIG. 13, when the semiconductor memory device is set to a test mode, a read/write control circuit 103 controls a node VDDM CONT 104 to be at a High potential at least while a word line 105 is open during the read operation. The logic operation of High/Low potentials shown in FIG. 13 is merely exemplary and can be freely set depending on the circuit design. The potential of the VDDM 100 is controlled to be slightly lowered when the potential of the VDDM CONT 104 becomes High.

Figure 3:
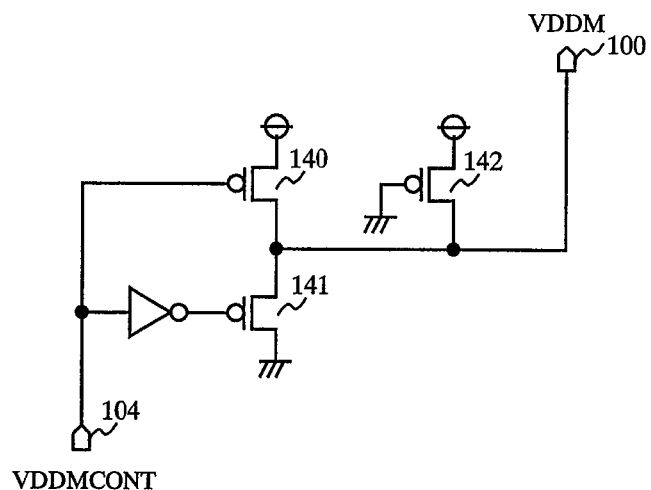
FIG. 3 is an exemplary configuration of a latch potential control circuit.

FIG. 3 shows an exemplary configuration of the latch potential control circuit 101. The VDDM CONT 104 is usually at a Low potential, but is controlled to be at High potential at least while the word line 105 is open during the read operation when the semiconductor memory device is set to the test mode. Owing to this control, in FIG. 3, a Pch Tr 140 is placed into an OFF state, and a Pch Tr 141 is placed into an ON state. Since the Pch Tr 142 is always in a ON state, the potential of the VDDM 100 is determined by the Pch Tr 142 and the Pch Tr 141, and is set to be lower than the power supply potential. The reason why the Pch Tr 140 is provided in addition to the Pch Tr 142 is as follows. Since the Pch Tr 142 is always in an ON state and has a high capability, the Pch Tr 141 provided for lowering the potential of the VDDM 100 would be required to have a high capability without the Pch Tr 140. As a result, there would be an inconvenience that a very strong through-current flows and therefore the power consumption is increased.

Figure 18:
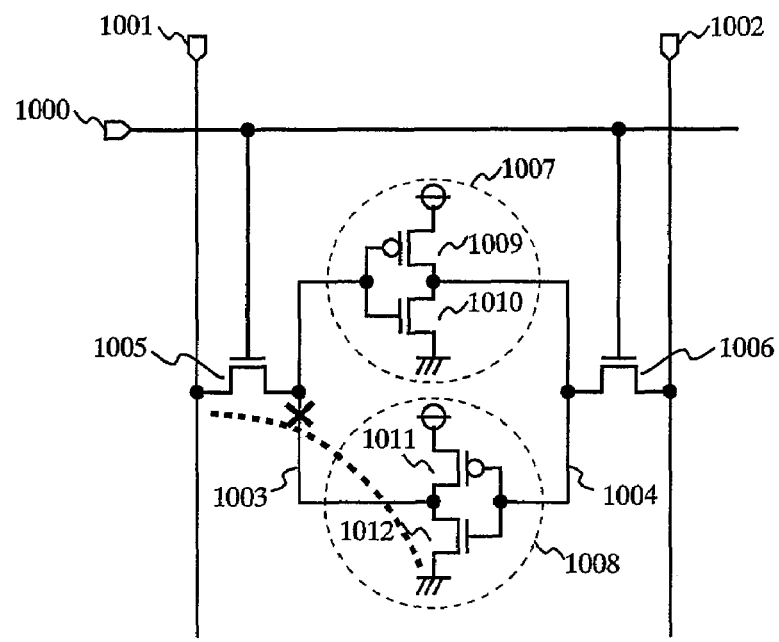
FIG. 18 and FIG. 19 each illustrate problems of a conventional SRAM memory cell.
Figure 19:
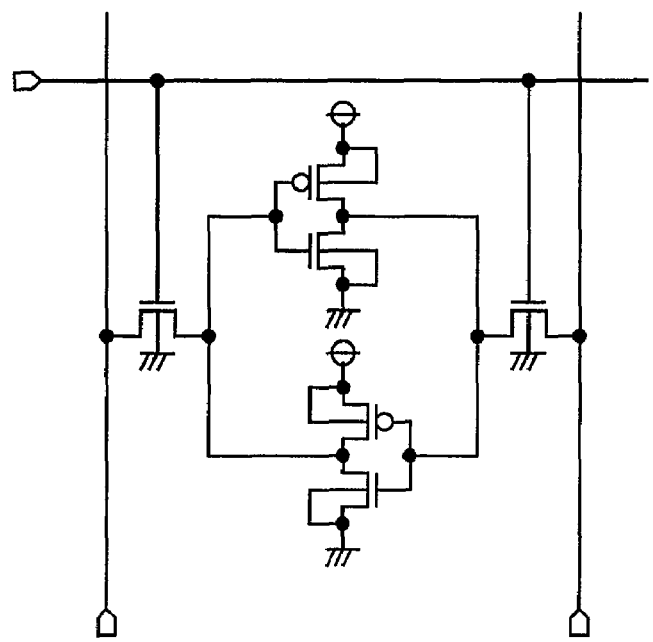

Referring to FIG. 18, what happens when the potential of the VDDM 100 is lowered will be described. The logic thresholds of the inverters 1007 and 1008 are lowered while the potential levels of the bit lines 1001 and 1002 remain the same. This decreases the latch retaining capability, and thus a state with a low SNM value can be created. When the node VDDM 100 is at a low potential, the write operation itself is made easy. Therefore, if the VDDM 100 is kept at a potential lower than the VDD potential for both the read and write operations, the write level cannot be inspected. In order to accurately inspect the write level margin, the potential of the VDDM 100 needs to be lowered only for the read operation and to be raised back to the normal power supply potential for the write operation.

When the potential of the VDDM 100 is lowered, the reduction in the magnitude of the cell current is less significant than in the case where the power supply potential of the entire memory macro is simply lowered, for the reasons described in the next paragraph. Because the reduction the magnitude of the cell current is less significant as described above, a stress test can be performed with only the SNM being effectively reduced. As a result, a margin for the over-time SNM deterioration can be obtained without any loss in the yield being caused by other factors such as the cell current or the write level.

Since the bit lines 106 and 107 are kept at High potential, the source-drain voltage of the access Tr 1005 and the drive Tr 1012 is not changed. The access Tr 1005 is usually set to have a higher resistance than the drive Tr 1012 in order to suppress the potential of the intermediate node 1003 from being raised when the word line 105 is open and thus to obtain resistance against the reduction in the SNM. Therefore, the access Tr 1005 is more dominant than the drive Tr 1012 on the cell current. In this embodiment, the potential of the word line 105, which is equal to the gate potential of the access Tr 1005 having a larger influence on the cell current, is kept High. Therefore, the reduction in the magnitude of the cell current merely corresponds to the slight reduction in the gate potential of the drive Tr 1012 and thus is very small, unlike in the case where the power supply potential of the entire memory macro is lowered to lower the SNM value.

Referring to FIG. 1, in order to reduce the SNM value significantly, it is desirable that the drive power supply potential of the word line 105 and the precharge power supply potential of the bit lines 106 and 107 are kept higher than the lower power supply potential controlled by the latch control circuit 101. Even when one of the drive power supply potential of the word line 105 and the precharge power supply potential of the bit lines 106 and 107 is kept higher and the other is equal to the lower power supply potential controlled by the latch control circuit 101, the effect of reducing the SNM value is provided although being less significant. When the reduction in the SNM value to be assumed as the over-time deterioration is relatively small, only the word line 105 may be kept at the normal potential while both the latch potential and the precharge potential may be slightly lowered, for example. In this manner, the reduction in the SNM value can be adjusted.

According to claim 1 of the present invention, the SNM stress test is also used as the read operation of the normal operation test, utilizing the advantage that "the deterioration in the magnitude of the cell current is very small even as compared with the deterioration in the normal operation mode". Thus, no test pattern needs to be added for the SNM test, which restricts an increase in the inspection cost.

According to claim 3 of the present invention, the magnitude of the cell current is increased than that in the normal operation mode because the gate potential is boosted. According to claim 4 of the present invention, the magnitude of the cell current is increased than that in the normal operation mode because the potential of the bit lines is boosted. For this reason, the yield is not reduced for any reason related to the cell current. The control on the VDDM 100 may be performed only on the column which is a target of operation. In this case, the driving load is alleviated and thus the dynamic control of the VDDM 100 is made easier. This makes it easier to inspect only the read cycle during the normal inspection pattern for the SNM stress test. This is realized by claim 9. An over-time deterioration amount of the semiconductor memory device may be assumed in consideration of both an over-time deterioration amount of the SNM and an over-time deterioration amount caused by high temperature, and the inspection may be conducted at room temperature or a low temperature. This eliminates the necessity of performing an inspection at a plurality of temperatures, which can reduce the cost.

Referring to FIG. 1, a method for obtaining a write level margin for the over-time deterioration or defect caused by operational environment will be described. After the semiconductor memory device is set to the test mode, the latch potential control circuit 101 raises the potential of the VDDM 100 only during the write cycle in the test mode (opposite to the operation according to claim 1, which concerns the SNM in the read operation). This increases the retaining capability of the inverter latch, and thus a stress test mode for the write level can be created. A method for raising the potential of the VDDM 100 to a level higher than the potential in the normal operation is realized by substantially the same concept as that of the circuit shown in FIG. 7 and FIG. 8 (third embodiment), and will be described later in detail. The effect provided by controlling the write level of each column in the stress test mode is substantially the same as the effect provided by the control performed in the SNM stress test mode according to claim 9. The above-mentioned control for the write level is realized by claim 16. The latch potential control circuit 101 may be used for raising the SNM in the normal operation mode and may be used as a write level stress circuit in the test mode. In this manner, the circuit area can be reduced. An over-time deterioration amount of the semiconductor memory device may be assumed in consideration of both an over-time deterioration amount of the write level and an over-time deterioration amount caused by low temperature, and the inspection may be conducted at room temperature or a low temperature. At a low temperature, the deterioration is more significant than at room temperature because Vt is raised.

Second Embodiment

Figure 4:
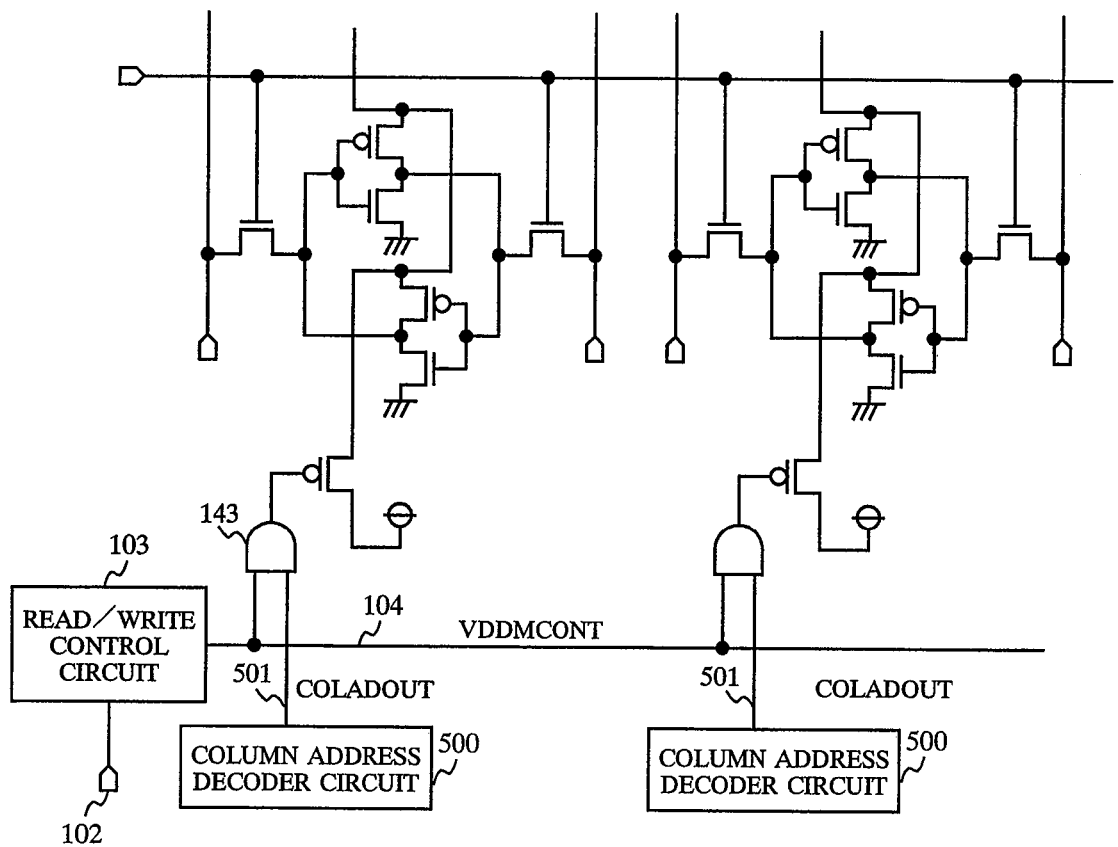
FIG. 4 shows a main circuit configuration of a semiconductor memory device according to a second embodiment of the present invention.
Figure 8:
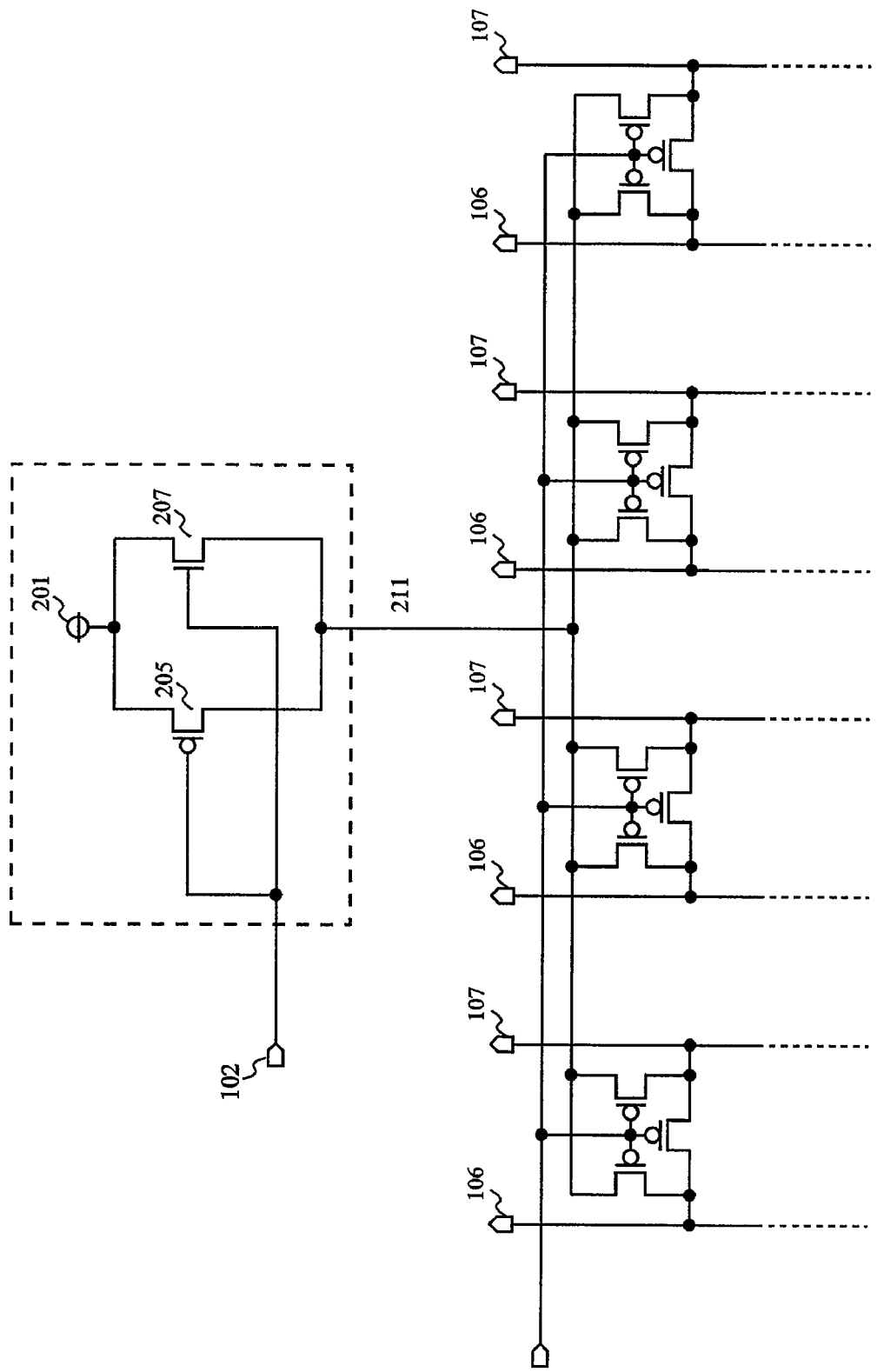

A semiconductor memory device according to a second embodiment of the present invention will be described with reference to FIG. 4 and FIG. 8. In the second embodiment, a technology for VDDM cutoff will be described, which mainly corresponds to claims 2, 7 and 8. In FIG. 4, a reference character 500 is a column address decoder circuit and a reference character 501 is an output signal "COLADOUT" from the column address decoder circuit 500.

During the read operation in the test mode, an SNM stress mode can be created by setting the VDDM 100 at a certain potential using the circuit in FIG. 3. Alternatively, as shown in FIG. 4, an SNM stress mode can be created by cutting off the power supply to the VDDM 100 at the inverter latch potential, using a cutoff Tr. This VDDM cutoff technique, which uses a small number of devices and does not need a through-current component for obtaining a potential, is advantageous in consuming a very low magnitude of current, despite that it is more difficult to obtain an intended potential as compared to the first embodiment. This VDDM cutoff technique is realized by claim 2.

Figure 14:
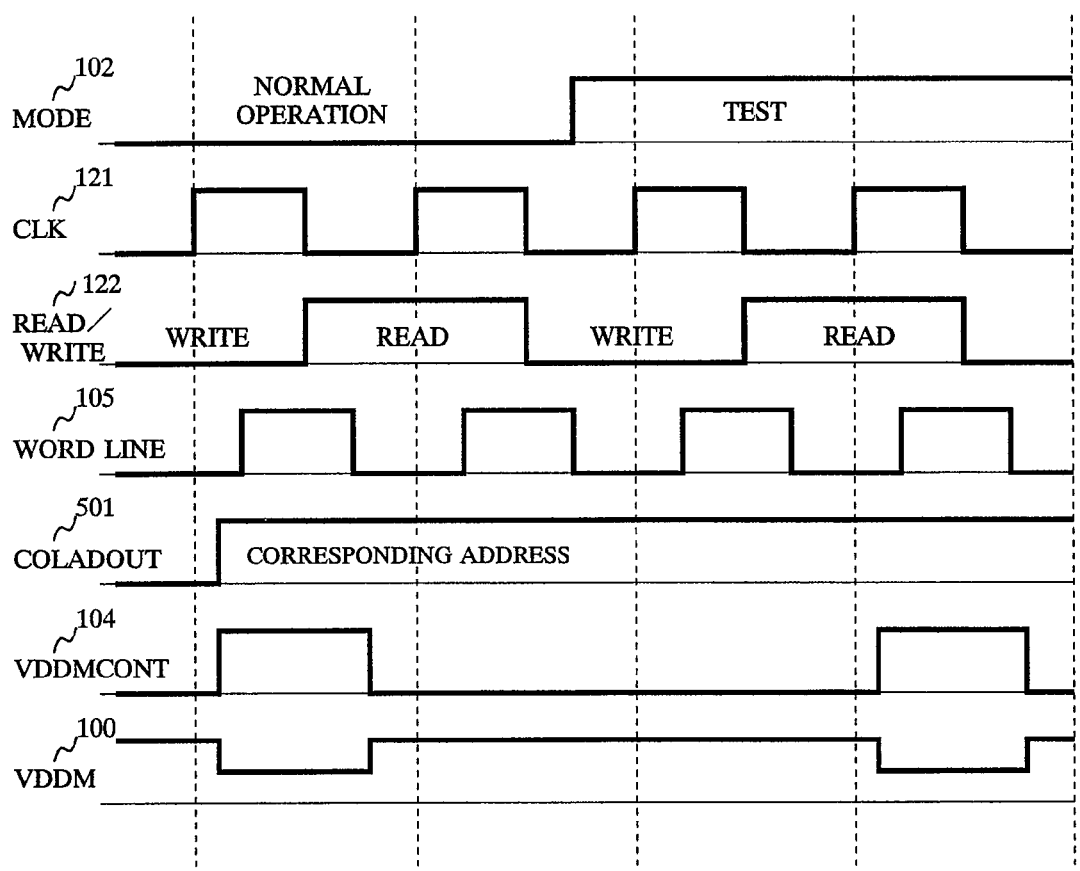
FIG. 14 is an operation timing diagram of the semiconductor memory device according to the second embodiment.

The control circuit for the VDDM 100 shown in FIG. 3 is usually provided for the control as shown in FIG. 13. Alternatively, the control circuit shown in FIG. 3 may be easily adapted for use in the normal write operation as shown in FIG. 14 by merely changing logics. Owing to such an arrangement, the circuit can be used as a write guarantee circuit in the normal operation mode and can be used for the SNM stress test in the test mode. Thus, the area of the semiconductor memory device can be effectively used. For practical use, the level of the VDDM 100 may be the same for the read operation and the write operation, with only the manner of controlling the VDDM 100 by the VDDM CONT 104 being changed. Preferably, different potential levels are adopted for the use as the write guarantee circuit and for the use in the SNM stress mode. In this manner, at least a part of the device for obtaining the potential levels is used for both purposes. Thus, both characteristics are optimized while saving the area of silicon. This is realized by claims 7 and 8.

Third Embodiment

Figure 5:
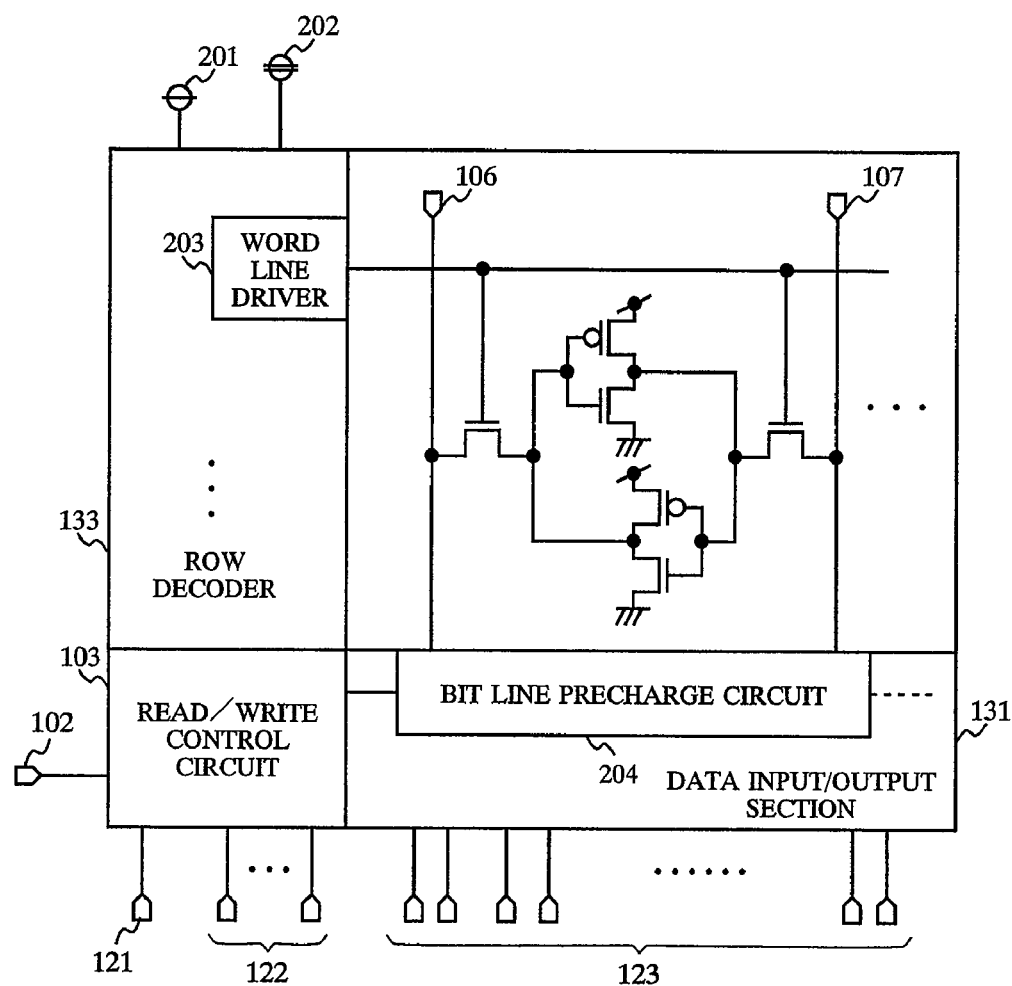
FIG. 5 shows a main circuit configuration of a semiconductor memory device according to a third embodiment of the present invention.

A semiconductor memory device according to a third embodiment of the present invention will be described with reference to FIG. 5 through FIG. 8. In the third embodiment, a technology for boosting the voltage of word line and boosting the voltage of the bit lines will be described, which mainly corresponds to claims 3 and 4. In FIG. 5, a reference character 204 is a bit line precharge circuit.

Figure 6:
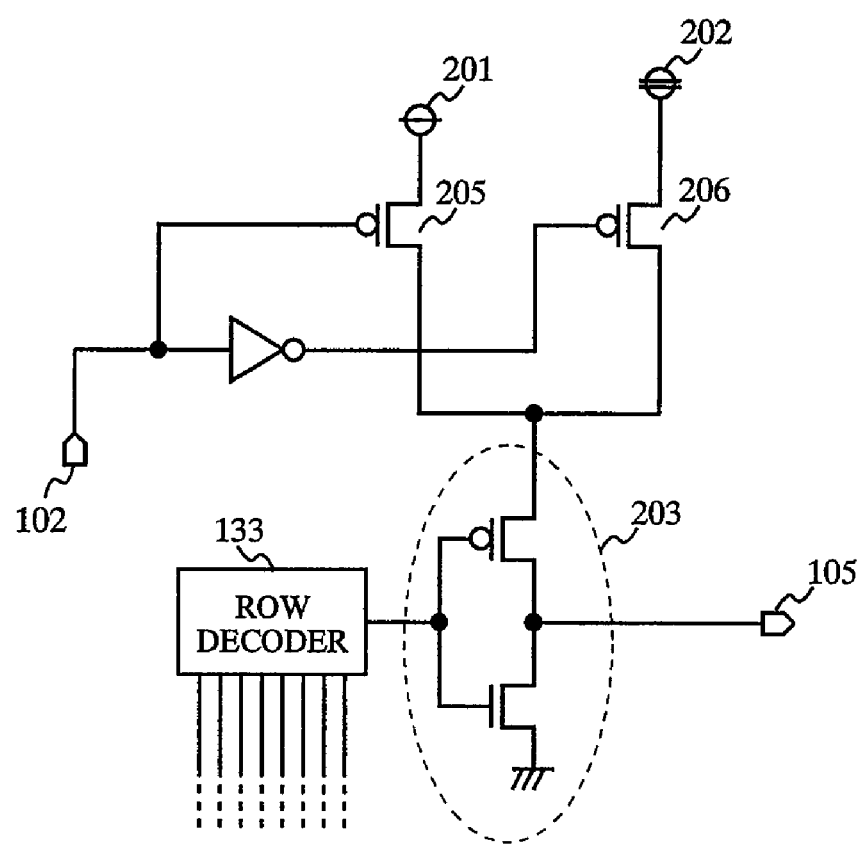
FIG. 6 is an exemplary circuit configuration of a word line driver.

As shown in FIG. 5, the memory cell is provided with a potential 201 for the normal operation mode and also with as lightly higher potential 202 for the test mode. FIG. 6 shows an exemplary configuration of a word line driver 203. The test mode setting pin 102 is set to a Low potential in the normal operation mode and to a High potential in the test mode. When the potential of the test mode setting pin 102 becomes High, a Pch Tr 205 is cut off and the potential 201 for the normal operation mode is prevented from being supplied. Instead, a Pch Tr 206 is placed into an ON state and the potential 202 for the test mode is supplied. When the potential of the word line 105 becomes High, the ON resistance of the access Tr is reduced. As a result, the potential of the intermediate node 1003 shown in FIG. 18 is raised more and the SNM is reduced. Thus, an SNM stress mode can be created. This is realized by claim 3.

Figure 7:
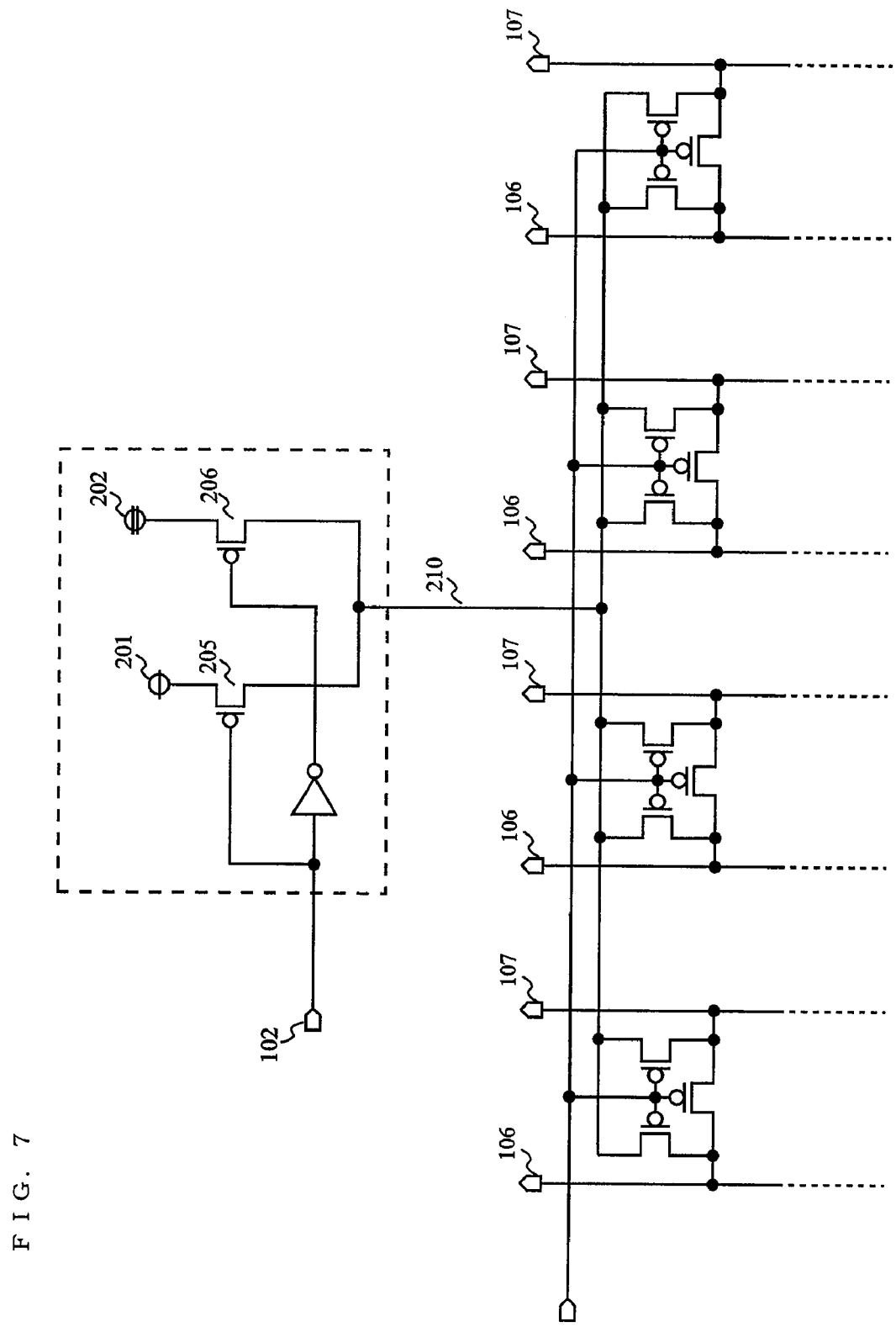
FIG. 7 and FIG. 8 are each an exemplary circuit configuration of a bit line precharge circuit.

FIG. 7 shows an exemplary configuration of a bit line precharge circuit 204 according to the present invention. The memory cell is provided with a potential 201 for the normal operation mode and also with a slightly higher potential 202 for the test mode. The control on the power supply by setting the test mode setting pin 102 is the same as that in the circuit in FIG. 6 according to claim 3. Since the potential of the bit lines is High, the intermediate node 1003 determined by the access Tr and the drive Tr is raised more. Thus, a low SNM state in which retained data is likely to be lost is created. This is realized by claim 4.

Fourth Embodiment

A semiconductor memory device according to a fourth embodiment of the present invention will be described with reference to FIG. 6 through FIG. 9. In the fourth embodiment, a technology regarding the write level stress mode other than the VDDM control described in the first embodiment will be described, which mainly corresponds to claims 11 through 13.

The test mode setting pin 102 is provided so that the test mode can be set. Then, only during the write operation in the test mode, the potential of the word line connected to the access Tr is lowered to a level lower than the potential in the normal operation mode. For controlling the power supply, the potential 202 shown in FIG. 6 is set to be lower than the potential 201 for the normal operation mode. Referring to FIG. 18, when the ON resistance of the access Tr 1005 is high, the potential of the intermediate node 1003 determined by the Pch Tr 1011 and the access Tr 1005 is not sufficiently lowered, as a result of which it becomes difficult to write. Thus, a write level stress mode can be created. Since this control is for reducing the ON resistance of the access Tr, the test mode needs to be set only for the write operation in order not to influence the cell. This is realized by claim 11.

Referring to FIG. 7, the potential 202 is set to be lower than the potential 201. In the test mode, the potential of the test mode setting pin 102 is raised to High and the potential 202 is supplied. When the bit line precharge potential is lowered, the potential of the higher bit line among the complementary bit lines is lowered, as a result of which it becomes difficult to write. The power may be provided from two power supplies as described above with reference to FIG. 6. Alternatively, the circuit may be provided with power from one power supply as shown in FIG. 8. In this case, the same level of potential is supplied for the normal operation mode and for the test mode, but a lower potential can be obtained by dividing the resistance or by lowering the Vt potential at the time of Tr driving. In the test mode, the potential of the test mode setting pin 102 is raised to High and the Pch Tr 205 is placed into an OFF state. Thus, the control is performed by lowering the Vt potential of the Nch Tr 207. In this circuit configuration, when the operation cycle is sufficiently short, the potential which is lower than the potential 201 by the Vt potential of the Nch Tr 207 is supplied to a node 211. This is realized by claim 12.

Figure 9:
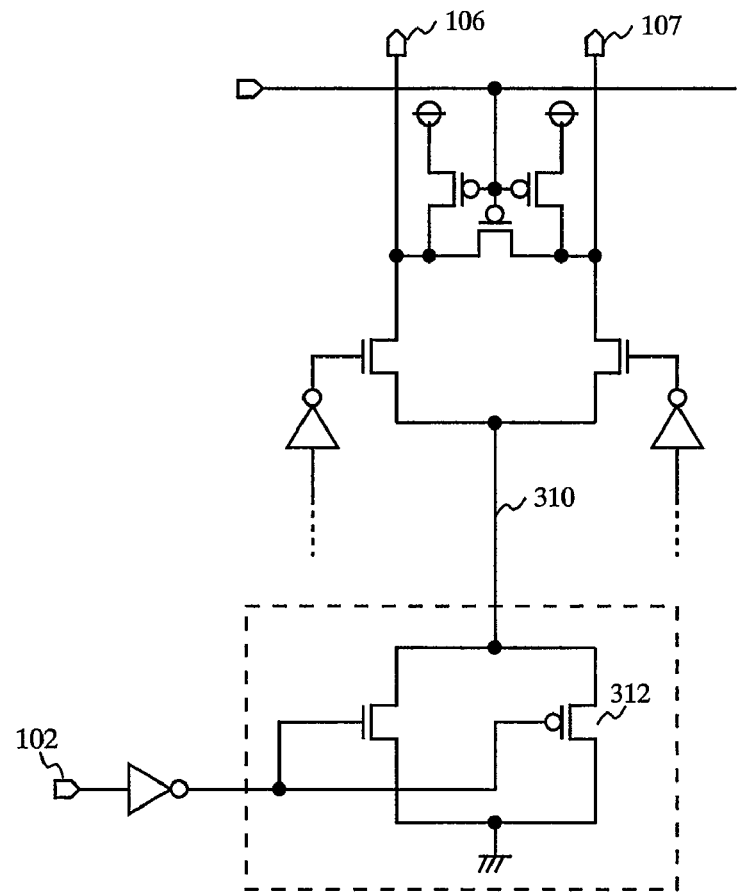
FIG. 9 shows a main circuit configuration of a semiconductor memory device according to a fourth embodiment of the present invention.
Figure 10:
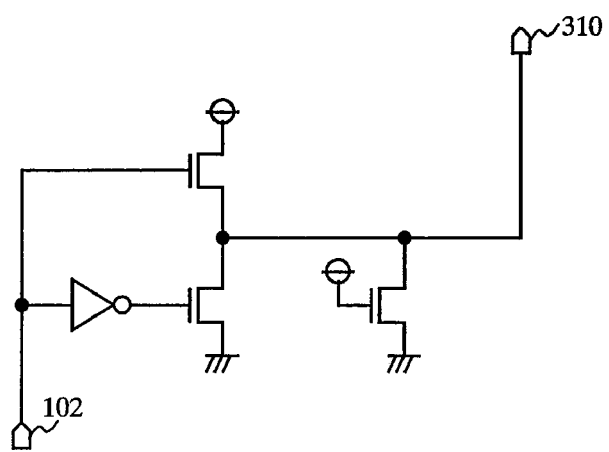
FIG. 10 is an exemplary circuit configuration of a control circuit for controlling the potential during the write operation to be low.

Oppositely to claim 12, the potential of the lower bit line among the complementary bit lines may be slightly raised during the write operation. In this manner also, a state where it is difficult to write can be created. FIG. 9 shows an exemplary circuit configuration in such a state. The circuit configuration shown in FIG. 9 is usable in place of a conventional write buffer circuit (FIG. 20). In FIG. 20, the VSS potential is transferred to the bit lines 106 and 107 via the Nch Tr. By contrast, in FIG. 9, when the test mode setting pin 102 is set to a High potential, a node 310 is usually supplied with a potential via a Pch Tr 312. Therefore, when the operation cycle is sufficiently short, the potential of the node 310 is higher than the potential of the VSS node by Vt. Referring to FIG. 18, when the potential of the bit line 1002 is lowered to the lower level to perform the write operation, the Low level of the bit line 1002 does not become sufficiently low as compared to the logic threshold of the inverter 1008 which is operated at the Low potential. Thus, it becomes difficult to write. This is realized by claim 13. Alternatively, as shown in FIG. 10, the supply potential to the VSSM may be defined by dividing the potential by a Tr or a resistor.

Fifth Embodiment

A semiconductor memory device according to a fifth embodiment of the present invention will be described with reference to FIG. 5, FIG. 6, and FIG. 11 through FIG. 13. In the fifth embodiment, a technology regarding back bias will be described, which mainly corresponds to claims 5, 6, 14 and 15. In FIG. 13, a reference character "MODE" is a signal which represents a mode (normal operation and test, etc) of the memory, and a reference character "READ/WRITE" is a signal which represents a read cycle/write cycle of the memory. The read cycle is a period that a data is read from the memory, and the write cycle is a period that a data is written to the memory.

In the first and second embodiments described above, the source potential provided by the memory latch power supply is controlled. In the third embodiment, the substrate potential of the Pch Tr of the memory cell is electrically separated from the source potential of the Pch Tr. In the test mode, the substrate potential of the Pch Tr is always supplied with a back bias, or the control is performed at the same timing as the VDDM CONT 104 shown in FIG. 13. By controlling the substrate potential of the Pch Tr of the memory cell in the direction in which the back bias is supplied, the threshold of the Pch Tr becomes high. Thus, an inspection is made possible in a state simulating the state after the over-time deterioration.

According to claim 1 described in the first embodiment, the deterioration in the cell current is less significant than the amount by which the power supply potential is lowered in expectation of the SNM reduction. The technology of using the substrate potential of the Pch Tr in this embodiment is superior on this point and has an advantage that "there is substantially no difference in the magnitude of the cell current from the normal operation mode". Because the magnitude of the cell current is the same as that in the normal inspection, the read operation in the normal inspection can be easily replaced with the SNM stress test. This is realized by claim 5.

As shown in FIG. 6, the substrate potential of the Nch Tr of the memory cell may be separated from the source potential of the Nch Tr and a forward bias may be applied to the substrate potential of the Nch Tr. For deteriorating the SNM, substantially the same effect is provided. This is realized by claim 6. In this test mode, a larger magnitude of cell current is obtained than that in the normal operation mode. Therefore, the yield cannot be reduced for any reason related to the cell current. However, since the magnitude of the cell current is larger than that in the normal operation mode, a test for determining the magnitude of the cell current needs to be separately performed, which is inferior to the technology according to claim 5.

Figure 11:
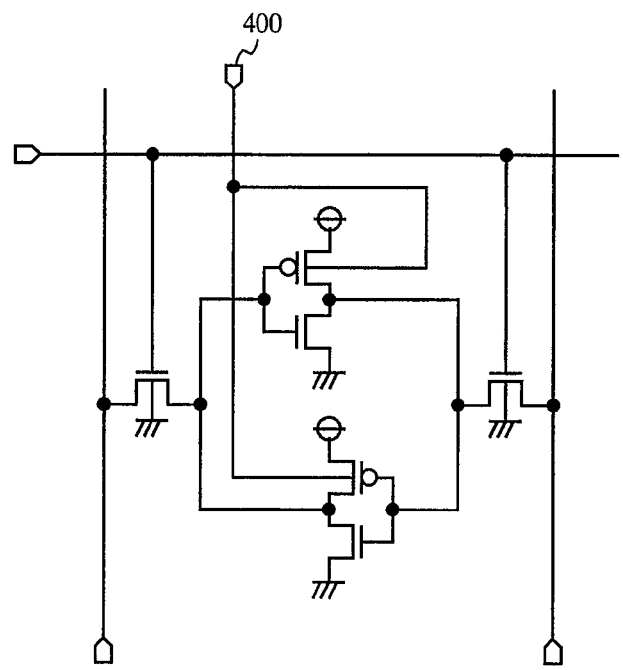
FIG. 11 and FIG. 12 each show a main circuit configuration of a semiconductor memory device according to a fifth embodiment of the present invention.
Figure 12:
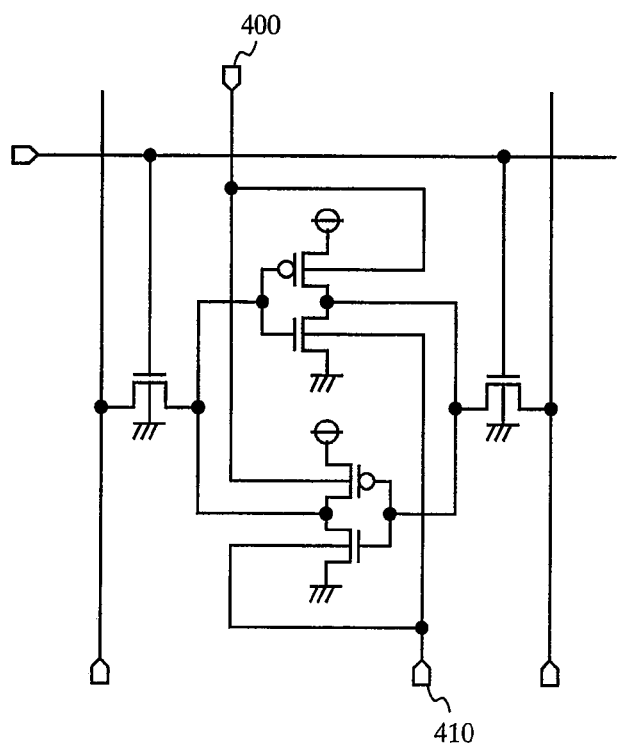

By contrast, a forward bias may be applied to a substrate potential 400 of a Pch Tr of a memory cell shown in FIG. 11. In this case, the threshold level of the Pch Tr becomes low. Thus, an inspection is made possible in a state simulating the write level after the over-time deterioration. This is realized by claim 14. As shown in FIG. 12, the substrate potential of the Nch Tr of the memory cell may be separated from the source potential of the Nch Tr and a back bias may be applied to the substrate potential 410 of the Nch Tr. Substantially the same effect is provided. This is realized by claim 15.

Sixth Embodiment

Figure 16:
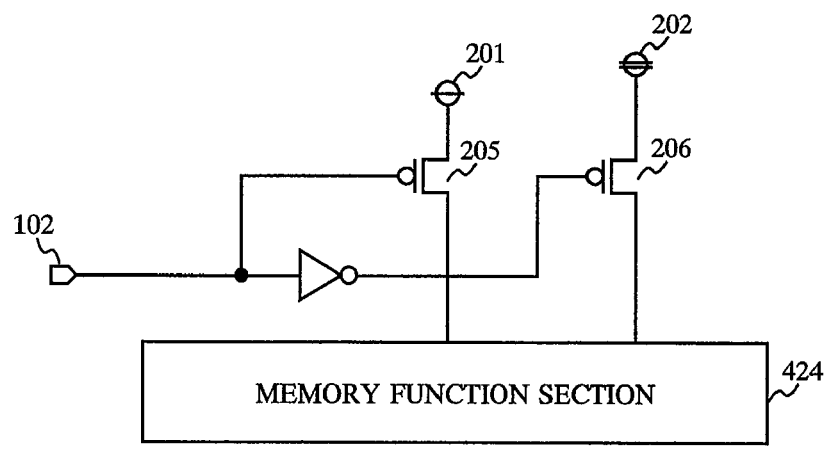
FIG. 16 and FIG. 17 each show a main circuit configuration of a semiconductor memory device according to a sixth embodiment of the present invention.
Figure 17:
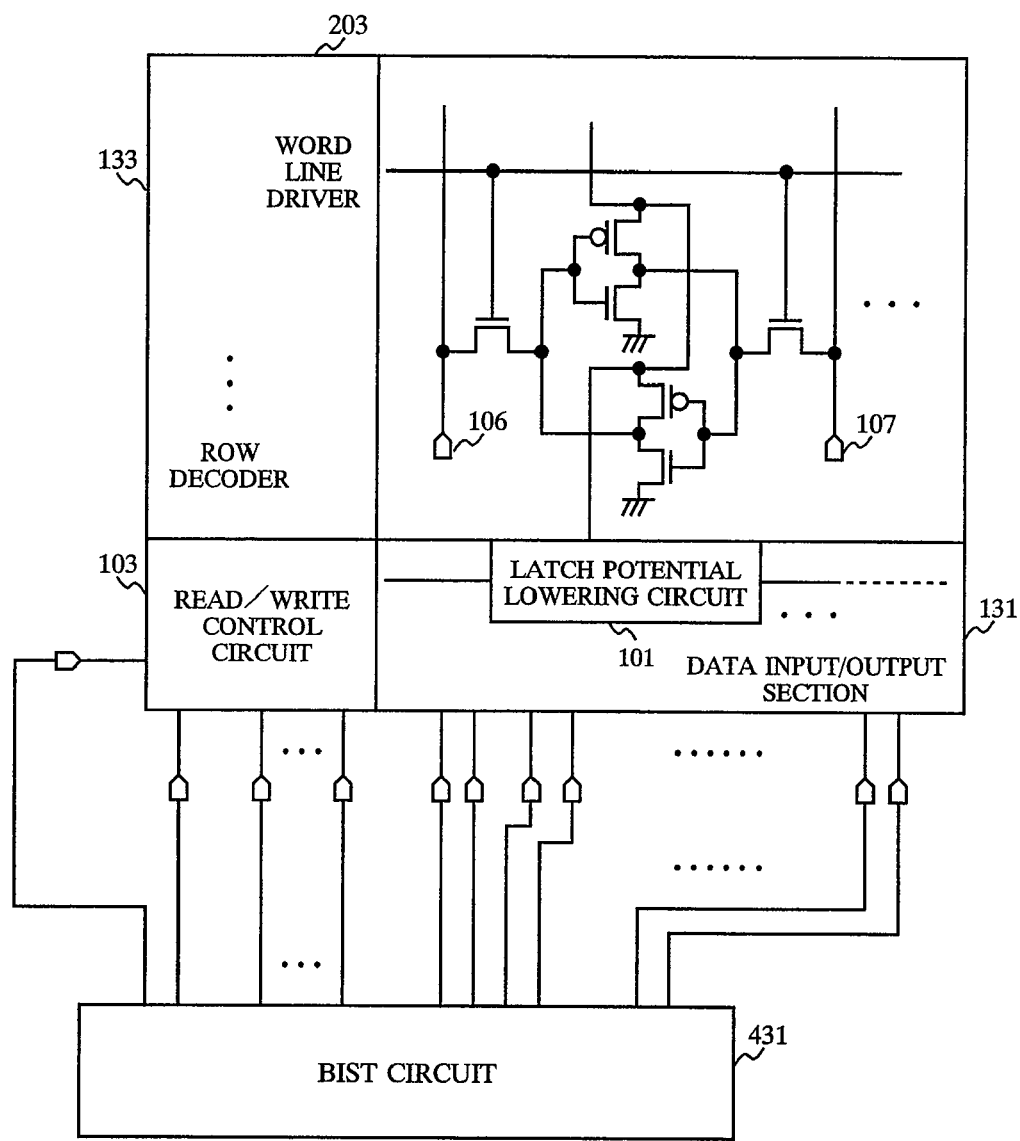

A semiconductor memory device according to a sixth embodiment of the present invention will be described with reference to FIG. 15 through FIG. 17. In the sixth embodiment, a technology for determining whether to lower the supply voltage, to perform pseudo-read, or to use BIST (Built In Self Test), which mainly corresponds to claims 17 through 22. In FIG. 16, a reference character 424 is a memory function section.

The SNM usually discussed is an SNM in the case where the word line is open. Even where the word line is kept closed, the cell having a weak stability loses retained data by lowering the supply voltage. This allows screening. This is realized by claim 19. Unlike the technologies according to claims 1 through 9 requiring power supply separation, this method does not require power supply separation. Therefore, this method has advantages of being easy to implement, involving no disadvantage regarding the area due to the power supply separation, and easily forming a stronger power supply system.

Usually, the logics and the SRAMs are connected to the same power supply. Therefore, a technique of lowering the power supply potential of the entire memory macro influences the logic section. In addition, when a plurality of macros are to be tested simultaneously with BIST, the plurality of macros of various capacities cannot be tested simultaneously because the macros are connected to the same power supply. In order to solve this problem, as shown in FIG. 16, the power supply potential of the entire macro or the memory cell is connected to the potential 202 which is lower than the potential 201 for the normal operation only in the test mode. In this manner, an SNM stress test can be performed only on the macro of interest.

Figure 15:
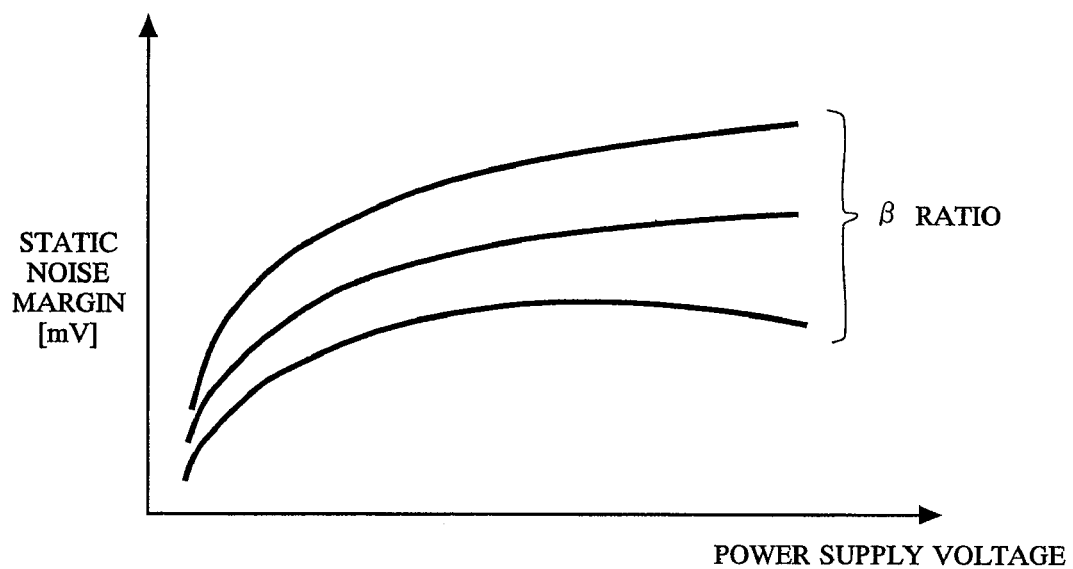
FIG. 15 illustrates the dependency of the SNM on the power supply voltage.

FIG. 15 shows the dependency of the SNM on the voltage. Three curves show the tendency at which the SNM varies in accordance with the β ratio (i.e., the driving capability of the drive Tr/the driving capability of the access Tr). The subject matter of claim 19 can be further improved so that the cell stability where the access Tr is open is the actual reading margin (i.e., SNM). The subject matter of claims 1 through 4 and claims 6 through 9 can be further improved so that the magnitude of the cell currency is the same as that in the normal operation. Such an improvement is realized by claim 20. According to claim 20, the read operation is performed while the word line 105 is open, but the pass/fail determination is not made on this stage. After the semiconductor memory device is returned to the normal operation, the reading operation is again performed and the pass/fail determination is made. Since the access Tr becomes conductive with a relatively small SNM, an SNM stress is applied. However, the read data is determined in the subsequent normal operation state. Therefore, no problem occurs regarding the cell current.

The technique of claim 20 is disadvantageous in that the inspection pattern takes a longer time because the reading operation is performed once without the pass/fail determination. In order to prevent the inspection time from being excessively long, a plurality of word lines may be simultaneously activated in the pseudo-read state in the test mode in which the pass/fail determination is not performed. This is realized by claim 21.

In this case, a sufficient SNM stress may not be applied because the potential of the bit line is lowered by the read data. In order to avoid this, in the pseudo-read state in the test mode in which the pass/fail determination is not performed, the bit line may be precharged. In this manner, the potential of the bit line is prevented from being lowered from a High level, and the SNM stress can be sufficiently applied. This is realized by claim 22.

The inspection time is important for the LSI inspection cost. In order to shorten the inspection time, BIST is often used in system LSIs. A plurality of memory macros can be inspected simultaneously by a built-in BIST circuit, which is effective to shorten the inspection time. A BIST circuit 431 is connected as shown in FIG. 17 and controls the inspection of a memory cell 430 embodying the subject matter of one of claims 1 through 16. The BIST circuit is applicable to inspection of actual LSIs in this manner.

While the invention has been described in detail, the foregoing description is in all aspects illustrative and not restrictive. It is understood that numerous other modifications and variations can be devised without departing from the scope of the invention.

What is claimed is:

1. A semiconductor memory device for storing information on a memory cell using a potential change in a word line and a bit line, the semiconductor memory device comprising:
   a memory cell having a circuit configuration in which a potential supplied to a source of a load transistor included in a latch section is different from at least one of a potential supplied to the word line and a potential supplied to the bit line;
   a first control circuit for switching a normal operation mode and a test mode to each other in accordance with a signal applied to a test mode setting pin; and
   a second control circuit for controlling the potential supplied to the source of the load transistor to be lower than at least one of the potential supplied to the word line and the potential supplied to the bit line, during an arbitrary period of at least a read operation in the test mode,
   wherein the second control circuit includes a plurality of transistors connected with each other in series between a power supply and a ground potential,
   the plurality of transistors includes at least a first transistor and a second transistor, and
   a connecting point, at which the first transistor connects with the second transistor, connects with the source of the load transistor.

2. The semiconductor memory device according to claim 1, wherein the second control circuit controls the potential supplied to the source of the load transistor to be lower than at least one of the potential supplied to the word line and the potential supplied to the bit line, also during an arbitrary period of a write operation in the normal operation mode.

3. The semiconductor memory device according to claim 1, wherein the second control circuit controls the potential in the test mode only on a column or a row on which a memory cell is present which is a target of the read operation.

4. A semiconductor memory device for storing information on a memory cell using a potential change in a word line and a bit line, the semiconductor memory device comprising:
   a memory cell having a circuit configuration in which a potential supplied to a source of a load transistor included in a latch section is different from at least one of a potential supplied to the word line and a potential supplied to the bit line;
   a first control circuit for switching a normal operation mode and a test mode to each other in accordance with a signal applied to a test mode setting pin; and
   a second control circuit for controlling the load transistor to be in a non-driven state by cutting off the supply of the potential to the source of the load transistor by a switching device, during an arbitrary period of at least a read operation in the test mode.

5. The semiconductor memory device according to claim 4, wherein the second control circuit controls the load transistor to be in the non-driven state by cutting off the supply of the potential to the source of the load transistor by the switching device, also during an arbitrary period of a write operation in the normal operation mode.

6. A semiconductor memory device for storing information on a memory cell using a potential change in a word line and a bit line, the semiconductor memory device comprising:
   a memory cell having a circuit configuration in which a potential supplied to the word line is different from at least one of a potential supplied to a source of a load transistor included in a latch section and a potential supplied to the bit line;
   a first control circuit for switching a normal operation mode and a test mode to each other in accordance with a signal applied to a test mode setting pin; and
   a second control circuit for controlling the potential supplied to the word line corresponding to at least one of the potential supplied to the source of the load transistor and the potential supplied to the bit line, and the potential supplied to the word line in a ON state, to be higher than a potential in the normal operation mode, during an arbitrary period of at least a read operation in the test mode.

7. A semiconductor memory device for storing information on a memory cell using a potential change in a word line and a bit line, the semiconductor memory device comprising:
   a memory cell having a circuit configuration in which a potential supplied to the bit line is different from at least one of a potential supplied to a source of a load transistor included in a latch section and a potential supplied to the word line;
   a first control circuit for switching a normal operation mode and a test mode to each other in accordance with a signal applied to a test mode setting pin; and
   a second control circuit for controlling the potential supplied to the bit line corresponding to at least one of the potential supplied to the source of the load transistor and the potential supplied to the word line to be higher than a potential in the normal operation mode, during an arbitrary period of at least a read operation in the test mode.

8. A semiconductor memory device for storing information on a memory cell using a potential change in a word line and a bit line, the semiconductor memory device comprising:
   a memory cell having a circuit configuration in which a potential supplied to a source of a load transistor included in a latch section is different from at least one of a potential supplied to the word line and a potential supplied to the bit line;
   a first control circuit for switching a normal operation mode and a test mode to each other in accordance with a signal applied to a test mode setting pin; and
   a second control circuit for controlling the potential supplied to the source of the load transistor to be higher than at least one of the potential supplied to the word line and the potential supplied to the bit line, during an arbitrary period of at least a write operation in the test mode.

9. A semiconductor memory device for storing information on a memory cell using a potential change in a word line and a bit line, the semiconductor memory device comprising:
   a memory cell having a circuit configuration in which a potential supplied to the word line is different from at least one of a potential supplied to a source of a load transistor included in a latch section and a potential supplied to the bit line;
   a first control circuit for switching a normal operation mode and a test mode to each other in accordance with a signal applied to a test mode setting pin; and
   a second control circuit for controlling the potential supplied to the word line corresponding to at least one of the potential supplied to the source of the load transistor and the potential supplied to the bit line to be lower than a potential in the normal operation mode, during an arbitrary period of at least a write operation in the test mode.

10. A semiconductor memory device for storing information on a memory cell using a potential change in a word line and bit lines, the semiconductor memory device comprising:
    a memory cell having a circuit configuration in which a potential supplied to the bit lines is different from at least one of a potential supplied to a source of a load transistor included in a latch section and a potential supplied to the word line;
    a first control circuit for switching a normal operation mode and a test mode to each other in accordance with a signal applied to a test mode setting pin; and
    a second control circuit for controlling the potential supplied to a bit line which is kept at a higher potential during a write operation, among the bit lines corresponding to at least one of the potential supplied to the source of the load transistor and the potential supplied to the word line, to be lower than a potential in the normal operation mode, during an arbitrary period of at least the write operation in the test mode.

11. A semiconductor memory device for storing information on a memory cell using a potential change in a word line and bit lines, the semiconductor memory device comprising:
    a memory cell having a circuit configuration in which a potential supplied to the bit lines is different from at least one of a potential supplied to a source of a load transistor included in a latch section and a potential supplied to the word line;
    a first control circuit for switching a normal operation mode and a test mode to each other in accordance with a signal applied to a test mode setting pin; and
    a second control circuit for controlling, in the test mode, a potential supplied to a bit line, among bit lines, which is operated at a lower potential during a write operation to the memory cell to be higher than a potential in the normal operation mode.

* * * * *